US009281162B2

(12) United States Patent
White et al.

(10) Patent No.: US 9,281,162 B2
(45) Date of Patent: Mar. 8, 2016

(54) SINGLE BEND ENERGY FILTER FOR CONTROLLING DEFLECTION OF CHARGED PARTICLE BEAM

(71) Applicant: ADVANCED ION BEAM TECHNOLOGY, INC., Hsinchu (TW)

(72) Inventors: Nicholas R. White, Manchester, MA (US); Kourosh Saadatmand, Merrimac, MA (US)

(73) Assignee: ADVANCED ION BEAM TECHNOLOGY, INC., Hsinchu (TW)

( * ) Notice: Subject to any disclaimer, the term of this patent is extended or adjusted under 35 U.S.C. 154(b) by 84 days.

(21) Appl. No.: 14/318,338

(22) Filed: Jun. 27, 2014

(65) Prior Publication Data
US 2015/0380206 A1 Dec. 31, 2015

(51) Int. Cl.
*H01J 37/147* (2006.01)
*H01J 37/317* (2006.01)

(52) U.S. Cl.
CPC ......... *H01J 37/1472* (2013.01); *H01J 37/3171* (2013.01); *H01J 2237/057* (2013.01)

(58) Field of Classification Search
USPC .................................................. 250/396 R
See application file for complete search history.

(56) References Cited

U.S. PATENT DOCUMENTS

| 6,946,667 B2 | 9/2005 | Chen et al. |
| 7,888,653 B2 | 2/2011 | Kellerman et al. |
| 2008/0258074 A1* | 10/2008 | Tsukihara ........... H01J 37/1477 250/396 R |
| 2011/0155921 A1* | 6/2011 | Kellerman .......... H01J 37/1477 250/396 R |
| 2012/0168637 A1* | 7/2012 | Radovanov ............. H01J 37/12 250/396 R |

OTHER PUBLICATIONS

O.A. Anderson, et al., "A Transverse Field Focusing (TFF) Accelerator for Intense Ribbon Ion Beams", IEEE Transactions on Nuclear Science, vol. NS-30, No. 4, Aug. 1983, pp. 3215-3217.

* cited by examiner

*Primary Examiner* — Kiet T Nguyen
(74) *Attorney, Agent, or Firm* — Muncy, Geissler, Olds & Lowe, P.C.

(57) ABSTRACT

A single bend energy filter for controlling deflection of a charged particle beam is provided. It includes a first array of electrodes and a second array of electrodes to define a beam channel for the charged particle beam to pass through; an unmatched steering electrode among the first array of electrodes for tuning the bend angle of the charged particle beam; and a plurality of electrical biases applied to the first array of electrodes, the second array of electrodes and the unmatched steering electrode, wherein portion or all of the electrodes have different shapes. A method for controlling deflection of a charged particle beam is also provided. Depending on use of an unmatched steering electrode, the bend angle of the charged particle beam may be fine-tuned, so as to effectively control the deflection of the charged particle beam to achieve a centered beam at the wafer plane.

16 Claims, 4 Drawing Sheets

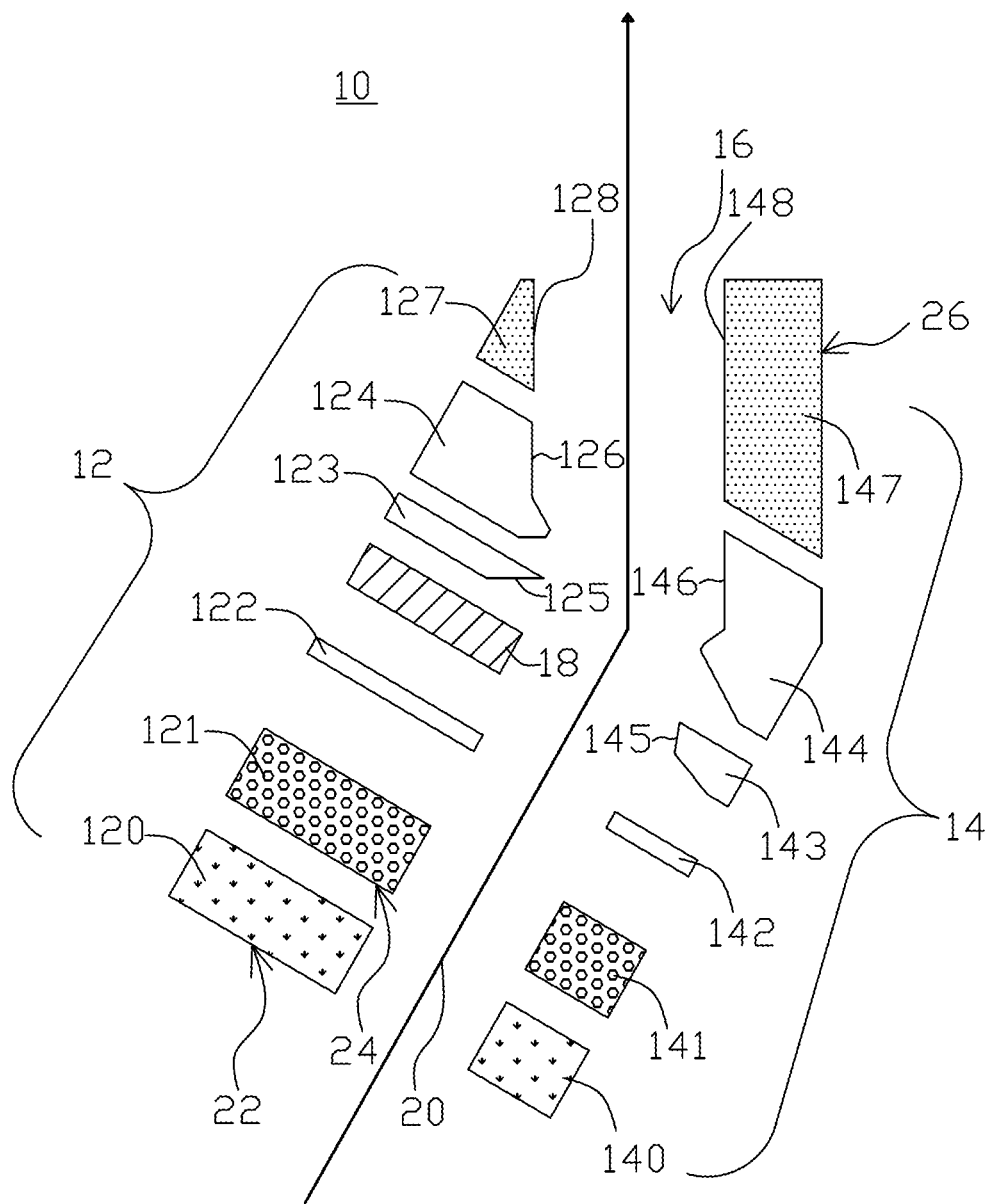
Fig. 4 (top view)

SINGLE BEND ENERGY FILTER FOR CONTROLLING DEFLECTION OF CHARGED PARTICLE BEAM

BACKGROUND OF THE INVENTION

1. Field of the Invention

The present invention relates to ion implantation, and, more especially, to an apparatus and method for controlling a deflection of a charged particle beam.

2. Description of the Prior Art

Ion implanters are used in the manufacture of semiconductor devices and other materials. In such ion implanters, semiconductor wafers or other substrates are modified by implanting atoms of a desired species into the body of the wafer, for example to form regions of varying conductivity.

Charged particle filters, sometimes referred to as particle separators, are known in the art for the purpose of separating out unwanted particles from wanted particles in a particle beam. Generally, a sector magnetic field can be used to provide separation of charged particles by their momentum to charge ratio. Such devices are commonly used as mass analyzers and in mass spectrometry, to separate particles by mass when the energy and charge of the particles is assumed to be the same.

On the other hand, an electric field on its own may also be used for particle separation, in which case the filter acts as an energy filter for particles of the same charge state.

Considering in particular the application of charged particle filters to ion implanters, ion implanters using radio frequency acceleration to produce a beam of ions have a band of energies, so that an energy filter is required if the beam to be implanted is to have high energy purity. The use of a pure electrostatic energy filter which bends the accelerated beam through a predetermined angle in order to provide the required energy dispersion at an exit aperture of the filter, can work satisfactorily at high energies.

U.S. Pat. No. 6,946,667 provides an ion implantation apparatus including an ion source for extracting an ion beam to travel along an original ion beam path for implanting a target wafer; a set of deceleration electrodes disposed along the original ion beam path before the target wafer for decelerating and deflecting the ion beam to the target wafer; and a charged particle deflecting means, which generates a magnet field for filtering the ion beam, disposed between the ion source and the set of deceleration electrodes for deflecting the ion beam away from an original ion beam path and projecting to the set of electrodes with an incident angle relative to the original ion beam path. Here, the set of deceleration electrodes includes three pairs of electrodes arranged in sequence along an incident direction of the ion beam for generating an ion-beam filtering electric field.

U.S. Pat. No. 7,888,653 discloses a technique for independently controlling deflection, deceleration, and focus of an ion beam. The technique provides an electrode configuration including a set of entrance electrodes, one or more sets of suppression/focusing electrodes, and a set of exit electrodes. The potentials added for deflection to each set of electrodes are different and each set of electrodes may have a space/gap to allow an ion beam (e.g., a ribbon beam) to pass therethrough.

FIG. 1 depicts a side view of an electrode configuration in accordance with the U.S. Pat. No. 7,888,653. As shown in FIG. 1, the electrode configuration includes a set of entrance electrodes 302, five sets of suppression/focusing electrodes 304, and a set of exit electrodes 306. Each set of electrodes may have a space/gap to allow ion beam 30 to pass therethrough with a central ray trajectory. Here, each electrode is a regular electrode plate and the electrode configuration is a graded electrode configuration, such that each space/gap is the same along the central ray trajectory.

Besides the graded electrode configuration shown in FIG. 1, U.S. Pat. No. 7,888,653 also depicts that the electrode configuration is a flared electrode configuration or a parallel electrode configuration. In the flared electrode configuration of U.S. Pat. No. 7,888,653, as shown in FIG. 2, an opening for the ion beam 50 at the exit electrodes 506 may be greater than an opening for the ion beam 50 at the entrance electrodes 502. Accordingly, openings at each set of the suppression/focusing electrodes 504 may gradually increase or "flare" open.

In the parallel electrode configuration of U.S. Pat. No. 7,888,653, the upper electrodes are parallel with each other and the lower electrodes are parallel with each other. As shown in FIG. 3, the electrodes in the parallel lens configuration may be "flared" like the flared lens configuration of FIG. 2. For example, an opening for the ion beam 70 at the exit electrodes 706 may be greater than an opening for the ion beam 70 at the entrance electrodes 702. Accordingly, openings at each set of the suppression/focusing electrodes 704 may gradually increase or "flare" open.

In U.S. Pat. No. 7,888,653's disclosure, the upper and lower portions of suppression/focusing electrodes may all be regular shapes and each set of electrodes may be positioned symmetrically in its embodiment. Accordingly, the number of the upper suppression/focusing electrodes and the number of the lower suppression/focusing electrodes may be the same.

The foregoing set of deceleration electrodes disclosed by U.S. Pat. No. 6,946,667 and the one or more sets of suppression/focusing electrodes disclosed by U.S. Pat. No. 7,888,653 may not fine-tune the bend angle of the ion beam, so that the deflection of the ion beam may not be controlled with high efficiency.

The paper by O. A. Anderson, D. S. A Goldberg, W. S. Cooper, L. Soroka, "A Transverse Field Focusing (TFF) Accelerator for Intense Ribbon Ion Beam", IEEE Trans. NS-30 No. 4, 1983, page 3215 discloses that a transverse electric field is set up between pairs of deflecting plates in TFF Accelerator. Here, the charged particles passing between the plates are both deflected and strongly focused by the field. Acceleration is achieved by adjusting the mean voltage on each succeeding pair of plates.

SUMMARY OF THE INVENTION

One object of this invention is to provide a single bend energy filter for controlling deflection of a charged particle beam, wherein depending on use of an unmatched steering electrode, the bend angle of the charged particle beam may be fine-tuned, so as to effectively control the deflection of the charged particle beam to achieve a centered beam at the wafer plane.

Accordingly, one embodiment of the present invention provides a single bend energy filter for controlling deflection of a charged particle beam, including: a first array of electrodes and a second array of electrodes corresponding to each other to define a beam channel for the charged particle beam to pass through; an unmatched steering electrode among the first array of electrodes for tuning the bend angle of the charged particle beam; and a plurality of electrical biases applied to the first array of electrodes, the second array of electrodes and the unmatched steering electrode.

Another embodiment of the present invention provides a method for controlling deflection of a charged particle beam, including: providing a first array of electrodes and a second array of electrodes corresponding to each other to define a beam channel for the charged particle beam to pass through; arranging an unmatched steering electrode among the first array of electrodes for tuning the bend angle of the charged particle beam; and providing a plurality of electrical biases to the first array of electrodes, the second array of electrodes and the unmatched steering electrode.

BRIEF DESCRIPTION OF THE DRAWINGS

The foregoing aspects and many of the accompanying advantages of this invention will become more readily appreciated as the same become better understood by reference to the following detailed description, when taken in conjunction with the accompanying drawings, wherein:

FIG. 4 is a top view illustrating a configuration of a single bend energy filter in accordance with an embodiment of the present invention.

DESCRIPTION OF THE PREFERRED EMBODIMENT

Figure 1:
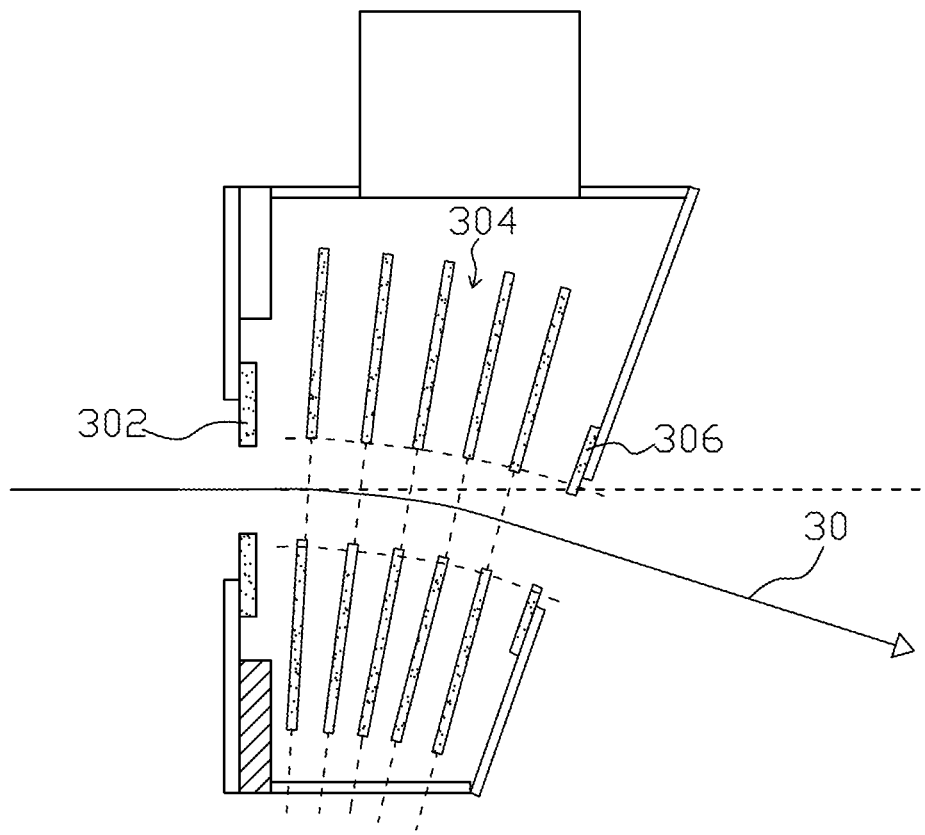
FIG. 1 depicts a side view of an electrode configuration in accordance with the U.S. Pat. No. 7,888,653.
Figure 2:
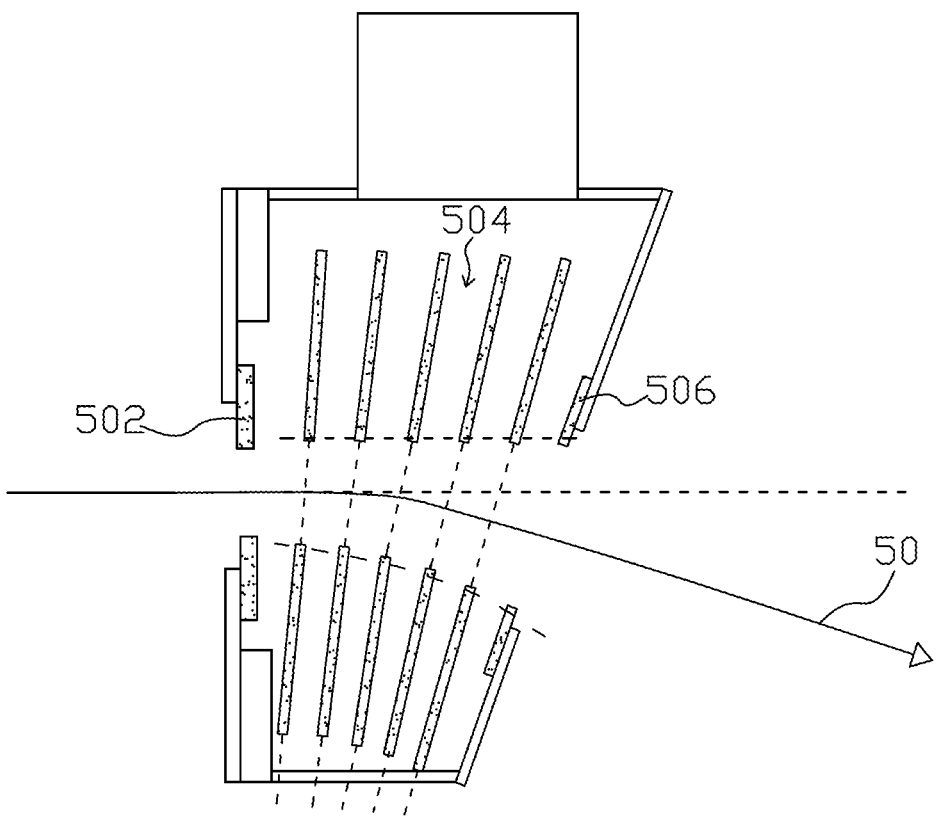
FIG. 2 depicts a side view of another electrode configuration in accordance with the U.S. Pat. No. 7,888,653.
Figure 3:
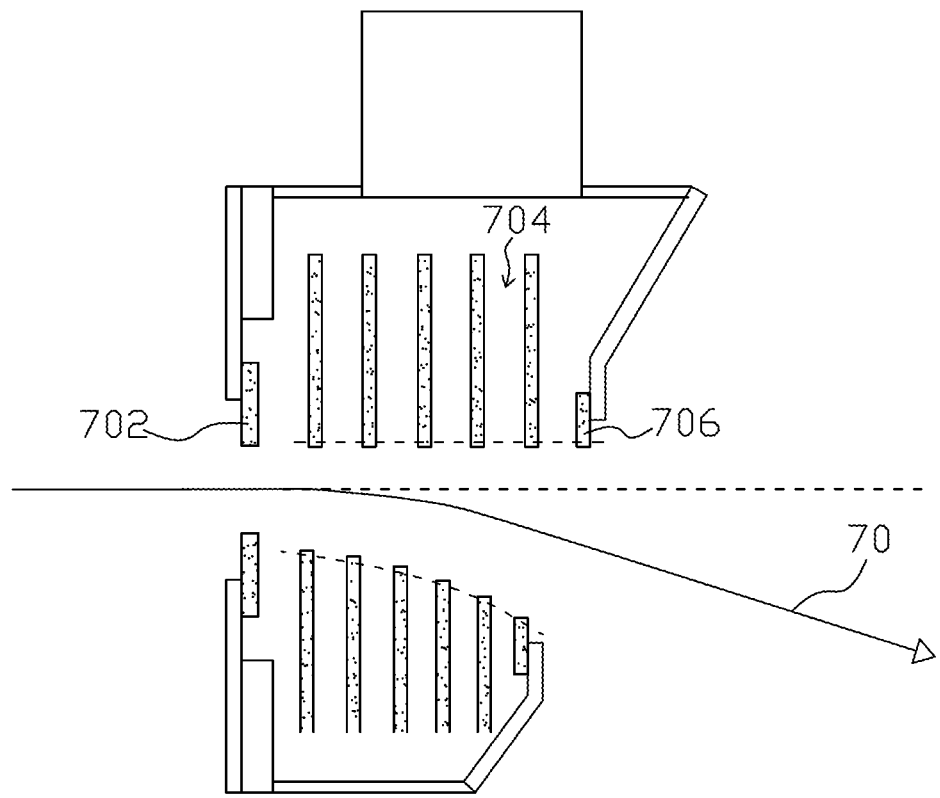
FIG. 3 depicts a side view of another electrode configuration in accordance with the U.S. Pat. No. 7,888,653.

The detailed description provided below and the preferred embodiments described are only for the purpose of description rather than for limiting the present invention.

FIG. 4 is a top view illustrating a configuration of a single bend energy filter in accordance with an embodiment of the present invention. A single bend energy filter 10 includes a first array of electrodes 12 and a second array of electrodes 14 corresponding to each other to define a beam channel 16 for the charged particle beam to pass through, and one unmatched steering electrode 18 arranged among the first array of electrodes 12 for tuning the bend angle of the charged particle beam. In one embodiment, the charged particle beam may be an ion beam 20 and a plurality of electrical biases is applied to the first array of electrodes, the second array of electrodes and the unmatched steering electrode 18. In one embodiment, the first array of electrodes 12 may be a left array of electrodes and the second array of electrodes 14 may be a right array of electrodes to define the beam channel 16, but not limited. In other embodiment, the first array of electrodes 12 may be an upper array of electrodes and the second array of electrodes 14 may be a lower array of electrodes.

The first array of electrodes 12 and the second array of electrodes 14 respectively include several electrodes, and each electrode among the first array of electrodes 12 and each electrode among the second array of electrodes 14 comprise an electrode set. Accordingly, the first array of electrodes 12 and the second array of electrodes 14 include several electrode sets, for example, a terminal electrode set 22, a suppression electrode set 24, a ground electrode set 26 and a plurality of decelerating electrode sets between the suppression electrode set 24 and the ground electrode set 26, wherein a portion of the decelerating electrode sets have different shapes and different applied electrical biases.

As shown in FIG. 4, in one embodiment, the terminal electrode set 22 may be two conductive pieces 120, 140 electrically coupled to each other or may be a one-piece structure with an aperture for the ion beam 20 to enter the beam channel 16. The suppression electrode set 24 includes two suppression electrodes 121, 141 respectively arranged at opposite sides of the beam channel 16 and adjacent the terminal electrode set 22, for adjusting divergence of the ion beam 20. The suppression electrodes 121, 141 also create a potential barrier for back-streaming electrons that are formed downstream through beam impact on surfaces or by background gas ionization.

In the present invention, the single bend energy filter 10 may operate in two modes known as decelerating mode and drift mode. In the decelerating mode, the ion beam 20 may be decelerated as the ion beam 20 passes through the beam channel 16 where the plurality of decelerating electrode sets are arranged as a pair of first decel electrodes 122, 142, a pair of second decel-bend electrodes 123, 143, and a pair of third decel-bend electrodes 124, 144. Here, the foregoing steering electrode 18 should be positioned before the bend so the bend action can be used to make the beam come out of the channel 16 straight. In one embodiment, the unmatched steering electrode 18 is arranged between one first decel electrode 122 and one second decel-bend electrode 123.

Still referring to FIG. 4, a pair of first decel electrodes 122, 142 respectively is arranged at opposite sides of the beam channel 16 and adjacent the suppression electrodes 121, 141. The pair of first decel electrodes 122, 142 is used to start decelerating the ion beam 20 while avoiding over-focusing. In one embodiment, the first decel electrodes 122, 142 are either flat plates or rod-shaped, and are parallel to the suppression electrodes 121, 141.

The pair of second decel-bend electrodes 123, 143 are at opposite sides of the beam channel 16 and have different shapes and different applied voltages. For example, the pair of second decel-bend electrodes 123, 143 may have oppositely sloped surfaces, and may be positioned unsymmetrically about the ion beam. In one embodiment, two opposite surfaces 125, 145 of the pair of second decel-bend electrodes 123, 143 have different slopes, for defining a rotated final decelerating field which starts the bending process of the ion beam 20. At this location, before the ion beam 20 starts to bend, the unmatched steering electrode 18, placed between one first decel electrode 122 and one second decel-bend electrode 123, is used for fine adjustment of the bend by modifying the electric field in the region to fine-tune the bend angle of the ion beam 20. In one embodiment, the unmatched steering electrode 18 is either a flat plate or rod-shaped and is located opposite the second decel-bend electrode 143 in the second array of electrodes 14.

The pair of third decel-bend electrodes 124, 144 is at opposite sides of the beam channel 16 and respectively adjacent the second decel-bend electrodes 123, 143. The pair of third decel-bend electrodes 124, 144 also have oppositely sloped surface, and are positioned unsymmetrically about the ion beam. In one embodiment, as shown in FIG. 4, two opposite surfaces 126, 146 of the pair of third decel-bend electrodes 124, 144 respectively are bent, for defining a rotated final decelerating field to complete the bending process of the ion beam. In the event that the second decel-bend electrodes are able to complete the entire bending process, the third decel-bend electrodes 124, 144 may be at ground potential. In this case, the third decel-bend electrodes will act as an extension of the ground electrode set 26 which is typically run at ground potential. In the embodiment, the ground electrode set 26 is a pair of ground electrodes 127, 147 at opposite sides of the beam channel 16, and two opposite surfaces 128, 148 of the pair of ground electrodes 127, 147 are parallel.

A plurality of electrical biases, provided by 20 kV power supplies, for example, are applied to the first array of electrodes 12, the second array of electrodes 14 and the unmatched steering electrode 18. Depending on the different electrical biases applied on the electrodes and different electrode shapes, the ion beam 20 travels in the centerline of the beam channel 16.

On the other hand, in a second operating mode, known as drift mode, the ion beam is configured to achieve high beam currents in drift mode without the need to use deceleration just prior to the wafer. In the drift mode, the shapes and configuration of the electrodes are the same or similar to the shapes and configuration of the electrodes in the decelerating mode. Only the applied voltages may be different in the drift mode and the decelerating mode of the operations. In one embodiment in the drift mode, one first decel electrode 122, one second decel-bend electrode 123, one third decel-bend electrode 124 among the first array of electrodes 12 and the unmatched steering electrode 18 are biased negative, and the other first decel electrode 142, the other second decel-bend electrode 143 and the other third decel-bend electrode 144 among the second array of electrodes 14 are biased positive.

In the decelerating mode or in the drift mode of operation, depending on application of the unmatched steering electrode 18 in the present invention, the bend angle of the ion beam may be fine-tuned, so as to effectively control the deflection of the ion beam to achieve a centered ion beam at the wafer plane.

In the present invention, a method for controlling deflection of a charged particle beam includes: providing a first array of electrodes and a second array of electrodes corresponding to each other to define a beam channel for the charged particle beam to pass through; arranging an unmatched steering electrode among the first array of electrodes for tuning the bend angle of the charged particle beam; and providing a plurality of electrical biases to the first array of electrodes, the second array of electrodes and the unmatched steering electrode.

The first array of electrodes and the second array of the electrode both include: a terminal electrode set for the charged particle beam entering the beam channel; a suppression electrode set for adjusting divergence of the charged particle beam in addition to blocking the back-streaming electrons; a pair of first decel electrodes for commencing deceleration of the charged particle beam; a pair of second decel-bend electrodes for defining a rotated final decelerating field to start the bending process; a pair of third decel-bend electrodes for defining another rotated final decelerating field to complete the bending process of the ion beam; and a ground electrode set at ground. Here, the unmatched steering electrode is arranged between one first decel electrode and one second decel-bend electrode.

Although the present invention has been explained in relation to its preferred embodiment, it is to be understood that other modifications and variation can be made without departing from the spirit and scope of the invention as hereafter claimed.

What is claimed is:

1. A single bend energy filter for controlling deflection of a charged particle beam, comprising:
    a first array of electrodes and a second array of electrodes corresponding to each other to define a beam channel for the charged particle beam to pass through;
    an unmatched steering electrode among the first array of electrodes for tuning a bend angle of the charged particle beam; and
    a plurality of electrical biases applied to the first array of electrodes, the second array of electrodes and the unmatched steering electrode.

2. The single bend energy filter for controlling deflection of a charged particle beam according to claim 1, wherein the first array of electrodes and the second array of the electrode both comprise:
    a terminal electrode set, for the charged particle beam entering the beam channel;
    a suppression electrode set, adjacent the terminal electrode set and at opposite sides of the beam channel for adjusting divergence of the charged particle beam in addition to blocking back-streaming electrons;
    a ground electrode set, at opposite sides of the beam channel; and
    a plurality of decelerating electrode sets, at opposite sides of the beam channel and between the suppression electrode set and the ground electrode set, wherein portion of the decelerating electrode sets have different shapes and have different applied electrical biases.

3. The single bend energy filter for controlling deflection of a charged particle beam according to claim 2, wherein the plurality of decelerating electrode sets comprises:
    a pair of first decel electrodes adjacent the suppression electrode set;
    a pair of second decel-bend electrodes near the pair of first decel electrodes;
    a pair of third decel-bend electrodes adjacent the pair of second decel-bend electrodes; and
    wherein the unmatched steering electrode is arranged between one first decel electrode of the first array of electrodes and one second decel-bend electrode of the first array of electrodes, to tune the bend angle of the charged particle beam.

4. The single bend energy filter for controlling deflection of a charged particle beam according to claim 3, wherein the pair of first decel electrodes are at opposite sides of the beam channel for commencing deceleration of the charged particle beam.

5. The single bend energy filter for controlling deflection of a charged particle beam according to claim 4, wherein the pair of second decel-bend electrodes are at opposite sides of the beam channel, and the pair of second decel-bend electrodes have different shapes and applied different voltages.

6. The single bend energy filter for controlling deflection of a charged particle beam according to claim 5, wherein two opposite surfaces of the pair of second decel-bend electrodes have different slopes, for defining a rotated final decelerating field to start the bending process.

7. The single bend energy filter for controlling deflection of a charged particle beam according to claim 6, wherein the pair of third decel-bend electrodes are at opposite sides of the beam channel, and two opposite surfaces of the pair of third decel-bend electrodes respectively are bent, for defining another rotated final decelerating field to complete the bending process of an ion beam.

8. The single bend energy filter for controlling deflection of a charged particle beam according to claim 7, wherein the ground electrode set is a pair of ground electrodes at opposite sides of the beam channel, and two opposite surfaces of the pair of ground electrodes are parallel.

9. The single bend energy filter for controlling deflection of a charged particle beam according to claim 4, wherein the pair of first decel electrodes are either flat plates or rod-shaped.

10. The single bend energy filter for controlling deflection of a charged particle beam according to claim 3, wherein one first decel electrode among the first array of electrodes, one second decel-bend electrode among the first array of electrodes, one third decel-bend electrode among the first array of electrodes and the unmatched steering electrode are biased negative, and the other of first decel electrode among the second array of electrodes, the other of second decel-bend electrode among the second array of electrodes and the other of third decel-bend electrode among the second array of electrodes are biased positive.

11. The single bend energy filter for controlling deflection of a charged particle beam according to claim 1, wherein the charged particle beam travels in the centerline of the beam channel.

12. A method for controlling deflection of a charged particle beam, comprising:
   providing a first array of electrodes and a second array of electrodes corresponding to each other to define a beam channel for the charged particle beam to pass through;
   arranging an unmatched steering electrode among the first array of electrodes for tuning a bend angle of the charged particle beam; and
   providing a plurality of electrical biases to the first array of electrodes, the second array of electrodes and the unmatched steering electrode.

13. The method for controlling deflection of a charged particle beam according to claim 12, wherein the first array of electrodes and the second array of the electrode both comprise:
   a terminal electrode set for the charged particle beam entering the beam channel;
   a suppression electrode set for adjusting divergence of the charged particle beam in addition to blocking back-streaming electrons;
   a pair of first decel electrodes for commencing deceleration of the charged particle beam;
   a pair of second decel-bend electrodes for defining a rotated decelerating field to start the bending process;
   a pair of third decel-bend electrodes for defining another rotated decelerating field to complete the bending process of an ion beam; and
   a ground electrode set at ground potential.

14. The method for controlling deflection of a charged particle beam according to claim 13, wherein the unmatched steering electrode is arranged between one first decel electrode and one second decel-bend electrode.

15. The method for controlling deflection of a charged particle beam according to claim 13, wherein one first decel electrode among the first array of electrodes, one second decel-bend electrode among the first array of electrodes, one third decel-bend electrode among the first array of electrodes and the unmatched steering electrode are biased negative, and the other of first decel electrode among the second array of electrodes, the other of second decel electrode among the second array of electrodes and the other of third decel electrode among the second array of electrodes are biased positive.

16. The method for controlling deflection of a charged particle beam according to claim 12, wherein the first array of electrodes and the second array of the electrode both comprise:
   a terminal electrode set, for the charged particle beam entering the beam channel;
   a suppression electrode set, adjacent the terminal electrode set and at opposite sides of the beam channel for adjusting divergence of the charged particle beam in addition to blocking back-streaming electrons;
   a ground electrode set, at opposite sides of the beam channel; and
   a plurality of decelerating electrode sets, at opposite sides of the beam channel and between the suppression electrode set and the ground electrode set, wherein portion of the decelerating electrode sets have different shapes and have different applied electrical biases, and the unmatched steering electrode is arranged among the decelerating electrode set.

* * * * *